(12) United States Patent
Yokota et al.

(10) Patent No.: US 7,795,788 B2
(45) Date of Patent: Sep. 14, 2010

(54) SURFACE ACOUSTIC WAVE ELEMENT AND COMMUNICATION DEVICE

(75) Inventors: Yuuko Yokota, Kyoto (JP); Shigehiko Nagamine, Kyoto (JP); Kiyo Yamahara, Kyoto (JP)

(73) Assignee: Kyocera Corporation, Kyoto (JP)

( * ) Notice: Subject to any disclaimer, the term of this patent is extended or adjusted under 35 U.S.C. 154(b) by 141 days.

(21) Appl. No.: 11/577,982

(22) PCT Filed: Oct. 25, 2005

(86) PCT No.: PCT/JP2005/019573

§ 371 (c)(1),
(2), (4) Date: Jun. 10, 2009

(87) PCT Pub. No.: WO2006/046545

PCT Pub. Date: May 4, 2006

(65) Prior Publication Data

US 2009/0243430 A1 Oct. 1, 2009

(30) Foreign Application Priority Data

Oct. 26, 2004 (JP) ............................. 2004-311244
Nov. 26, 2004 (JP) ............................. 2004-342835

(51) Int. Cl.
*H01L 41/047* (2006.01)
*H03H 9/25* (2006.01)

(52) U.S. Cl. ..................... 310/364; 310/313 R; 333/194

(58) Field of Classification Search ............. 310/313 R, 310/363, 364

See application file for complete search history.

(56) References Cited

U.S. PATENT DOCUMENTS

| 4,906,885 | A | 3/1990 | Kojima et al. | 310/313 |
|---|---|---|---|---|
| 5,773,917 | A | 6/1998 | Satoh et al. | 310/364 |
| 6,259,185 | B1 * | 7/2001 | Lai | 310/313 B |
| 6,297,580 | B1 * | 10/2001 | Takayama et al. | 310/364 |
| 6,407,486 | B1 | 6/2002 | Kimura et al. | 310/364 |
| 6,452,305 | B1 * | 9/2002 | Mellen et al. | 310/313 R |
| RE38,002 | E | 2/2003 | Satoh et al. | 29/25.35 |
| RE38,278 | E | 10/2003 | Satoh et al. | 310/313 |

(Continued)

FOREIGN PATENT DOCUMENTS

EP 0 524 754 A2 1/1993

(Continued)

*Primary Examiner*—Thomas M Dougherty
(74) *Attorney, Agent, or Firm*—Hogan Lovells US LLP

(57) ABSTRACT

An IDT electrode (3) on a piezoelectric substrate (2) has an electrode including first metal layers (31a, 31b) formed of titanium or a titanium alloy, or chromium or a chromium alloy and second metal layers (32a, 32b) formed of aluminum or an aluminum alloy, copper or a copper alloy, or gold or a gold alloy, which are laminated alternately. The orientation degrees in the first metal layer (31a) that is closest to the surface of the piezoelectric substrate (2) in the first metal layers (31a, 31b) and the second metal layer (32a) that is closest to the surface of the piezoelectric substrate (2) in the second metal layers (32a, 32b) are higher than the orientation degrees in the upper metal layers. As compared with the prior art where the orientation degrees in the first metal layers (31a, 31b) and the second metal layers (32a, 32b) are not considered, the power handling capability of the IDT electrode (3) can be significantly improved.

11 Claims, 6 Drawing Sheets

U.S. PATENT DOCUMENTS

| | | | |
|---|---|---|---|
| 6,909,341 B2* | 6/2005 | Takayama et al. | 333/193 |
| 7,423,365 B2* | 9/2008 | Tsutsumi et al. | 310/364 |
| 2002/0089256 A1* | 7/2002 | Taga | 310/313 R |
| 2003/0174028 A1* | 9/2003 | Takayama et al. | 333/193 |
| 2005/0174012 A1* | 8/2005 | Ozaki et al. | 310/313 B |
| 2007/0030094 A1* | 2/2007 | Omote | 333/133 |

FOREIGN PATENT DOCUMENTS

| | | |
|---|---|---|
| EP | 0 548 862 A1 | 6/1993 |
| JP | 64-80113 | 3/1989 |
| JP | 2-28120 | 2/1990 |
| JP | 04-288718 | 10/1992 |
| JP | 05-199062 | 8/1993 |
| JP | 05-226337 | 9/1993 |
| JP | 5-267979 | 10/1993 |
| JP | 06-350377 | 12/1994 |
| JP | 09-098043 | 4/1997 |
| JP | 2937613 | 6/1999 |
| JP | 2002-368568 | 12/2002 |
| JP | 3379049 | 12/2002 |
| JP | 3387060 | 1/2003 |
| JP | 2003-188672 | 7/2003 |
| JP | 2005-229566 | 8/2005 |
| WO | WO 99/54995 | 10/1999 |

* cited by examiner

SURFACE ACOUSTIC WAVE ELEMENT AND COMMUNICATION DEVICE

CROSS-REFERENCE TO THE RELATED APPLICATIONS

This application is a national phase of the international application No. PCT/JP2005/019573 filed Oct. 25, 2005, the entire contents of which are incorporated by reference. This application also claims benefit of priority under 35 U.S.C. §119 to Japanese Patent Application No. 2004-311244 filed Oct. 26, 2004 and Japanese Patent Application No. 2004-342835 filed Nov. 26, 2004, the entire contents of both of which are incorporated by reference.

TECHNICAL FIELD

The present invention relates to a surface acoustic wave element and a communication device. More specifically, the present invention relates to a surface acoustic wave element used as a duplexer, in particular, to a surface acoustic wave element including an IDT electrode with improved power handling capability, and a communication device using the surface acoustic wave element.

BACKGROUND ART

Recently, surface-mounted components are required to be smaller and lighter in accordance with the recent multi-functioned communication devices.

One of such surface-mounted components is a duplexer for separating signals into the signals in the transmitting frequency band and the signals in the receiving frequency band, and dielectrics have been employed for conventional duplexers. However, since dielectric duplexers cannot be miniaturized in principle in the frequency range in the present communication standards, and the attenuation characteristic in the vicinity of the passband cannot be made steep, it has been impossible to achieve sufficient characteristics in the communication standards where the transmitting frequency band and the receiving frequency band are close in the vicinity.

Therefore, in recent years, there have been an attempt to utilize a filter including an surface acoustic wave element for a duplexer.

While surface acoustic wave elements have been used as interstage filters, they have low power handling capability to be used as duplexers.

However, since this problem of low power handling capability has been solved by ideas for modifying the structure and material of IDT electrodes, there have been surface acoustic wave duplexers coming up, (hereinafter abbreviated as "SAW-DPX") having sizes smaller than dielectric duplexers and better attenuation characteristics in the vicinity of the passband than those of dielectric duplexers.

In general, a surface acoustic wave element is constructed by forming a plurality of exiting electrodes including an IDT electrode on a piezoelectric substrate. The period of the electrode fingers of the IDT electrode is almost determined by the sound speed of the material for the piezoelectric substrate and the frequency band in which the surface acoustic wave element is used. For example, when a surface acoustic wave filter used in a frequency band of 800 MHz is formed using single crystalline lithium tantalite as the piezoelectric substrate, the electrode finger period is about 4 um, that is, each of the width of one electrode finger and the distance (gap) between adjacent electrode fingers is about 1 um.

In addition, aluminum-based materials have been conventionally used for its ease of handling in manufacture and high conductivity.

In comparison to the surface acoustic wave filter including an IDT electrode comprising a large number of narrow electrode fingers arranged with narrow gaps in between, in a SAW-DPX, since a high frequency signal with an electric power of as large as 1 W is applied, the surface of the piezoelectric substrate vibrates physically strongly in response to the alternating electric field.

For this reason, since a great deal of stress is applied at a high frequency to the electrode, atoms of the material constituting the electrode migrate, whereby hillocks and cracks are generated in the electrode, finally resulting in destruction of the electrode. In particular, in the case of a material composed mainly of aluminum that constitutes the electrode, because of the presence of dangling bonds in grain boundaries of aluminum, only small quantity of energy is required for the movement of atoms, which causes greater migration.

Various approaches have been proposed on the electrode structure that can secure power handling capability in a surface acoustic wave element.

The first approach is adding metal elements in trace amounts to aluminum of the electrode material. The elements added to aluminum for the purpose of improving the power handling capability show two types of behaviors depending on the kind. The first behavior is to precipitate in the crystal grain boundaries of aluminum or to form an intermetallic compound with aluminum in the crystal grain boundaries of aluminum. Since these elements have a function to fill the dangling bonds of aluminum in the crystal grain boundaries, they have an effect to suppress migration of aluminum in the crystal grain boundaries. Elements having such functions include, namely, germanium, copper, palladium, silicon, and lithium.

The second behavior is to form solid solution with aluminum itself. Such elements work to prevent movement of dislocation that occurs in the crystal structure of aluminum caused by stress. Such elements include scandium, gallium, hafnium, zinc, zirconium, titanium, magnesium and the like. By adding at least one kind of these two kinds of elements to aluminum, the power handling capability of the surface acoustic wave element can be improved (for example, see Japanese Unexamined Patent Publication No. 1-80113, Japanese Unexamined Utility Model Publication No. 2-28120 and Japanese Unexamined Patent Publication No. 5-267979).

However, when the amounts of those elements added to aluminum are excessive, the resistance of the electrode becomes excessive, thereby applying electric power to the electrode results in a large heat generation. As a result, the thermal energy accelerates migration. Therefore, there should be proper amounts to be added.

The second approach is to eliminate the crystal grain boundaries themselves by single crystallization of aluminum (for example, see Japanese Unexamined Patent Publication No. 5-199062). Alternatively, if single crystallization is impossible, power handling capability can be enhanced by improving the degree of orientation of higher filling factor of aluminum crystals which hardly migrate. To achieve these objects, it is effective to provide an under layer film between the electrode made of aluminum and the piezoelectric substrate. For this under layer film, an intermetallic compound with aluminum, or a material whose heat of formation of the intermediate phase is positive may be chosen (for example, see Japanese Unexamined Patent Publication No. 4-090268).

The third approach is to relieve propagation of large stress in the electrode. Various techniques have been proposed for this purpose. One of them is minimizing the crystal grain size so as to disperse stress, because the larger the crystal grain size of aluminum is, the larger is the stress applied. Generally, it is believed that the size of a crystal grain is almost as large as the film thickness. Therefore, in order to obtain small crystal grains in an electrode with a predetermined thickness, a material that is different from aluminum (e.g. metal, nitride, silicide, etc.) may be inserted somewhere in the thickness direction (for example, see Japanese Unexamined Patent Publication No. 4-288718).

Another approach is proposed to insert a thick titanium layer between the electrode made of aluminum and the piezoelectric substrate (for example, see Japanese Unexamined Patent Publication No. 2002-368568). The thick titanium layer in this case does not have the function to orient aluminum as described referring to the second approach. This is because forming a thick film causes large irregularities on the surface. However, since titanium is a material with higher power handling capability than that of aluminum, inserting such a material between aluminum and a piezoelectric substrate can suppress propagation of stress to aluminum, whereby the power handling capability is improved.

In addition, the fourth approach is to use metal other than aluminum such as tantalum, gold, copper or the like as an electrode (for example, see Japanese Unexamined Patent Publication No. 9-98043).

DISCLOSURE OF THE INVENTION

Problems to be Solved by the Invention

However, sufficient power handling capability has not been achieved by implementing each of the foregoing approaches solely. Therefore, adopting a method has been proposed to combine the first approach with the second approach or third approach to further improve the power handling capability (for example, see International Patent Application Publication No. 2000/074235, Japanese Unexamined Patent Publication No. 7-122961 and International Patent Application Publication No. 1999/54995).

However, as the development of higher power communication devices proceeds, the SAW-DPX is required to have further improved power handling capability.

The fourth approach has a problem in that although the materials used for the fourth approach exhibit better power handling capability than that of the material mainly composed of aluminum, it is difficult to perform micro-fabrication process with those materials for forming an IDT electrode including a large number of narrow electrodes arranged with narrow gaps in between. In addition, such materials tend to have problems in terms of reliability such as low adherence to the piezoelectric substrate and oxidation proceeding with time, which may cause problems other than power handling capability.

An object of the present invention is to provide a surface acoustic wave element including an IDT electrode with improved power handling capability, and a communication device using the same.

Another object of the present invention is to provide a surface acoustic wave element including an IDT electrode having excellent micro-processability and no problem in reliability, and a communication device using the same.

Means for Solving the Problems

A surface acoustic wave element according to the present invention comprises: a piezoelectric substrate; and an IDT electrode formed on the piezoelectric substrate having an electrode formed with a plurality of first metal layers comprising titanium or a titanium alloy, or chromium or a chromium alloy, and at least one second metal layer comprising aluminum or an aluminum alloy, copper or a copper alloy, or gold or a gold alloy, the metal layers are alternately laminated, wherein the orientation degree in a layer in the first metal layers that is closest to a surface of the piezoelectric substrate is higher than the orientation degree in a layer in the first metal layers that is apart from the surface of the piezoelectric surface.

According to the surface acoustic wave element, when compared to a conventional IDT electrode where no consideration is given to the orientation degree of the first metal layers, it is possible to improve the orientation degree in a layer in the second metal layers that is immediately above a layer in the first metal layers closest to the piezoelectric substrate and is subject to the largest stress applied thereto because of its closest proximity to the surface of the piezoelectric substrate.

Since improvement of the orientation degree enhances resistance to migration, the power handling capability of the second metal layer is strengthened. Accordingly, a surface acoustic wave element having higher power handling capability can be realized.

Since the adherence between the second metal layers and the substrate is improved by the first metal layers, and the second metal layers are not directly in contact with the piezoelectric substrate, chemical reaction between the elements constituting the piezoelectric substrate and the second metal layers is suppressed, only little changes with time occur, so that a surface acoustic wave element that is excellent also in reliability can be realized.

When the surface acoustic wave element is one including a plurality of second metal layers, and the orientation degree in a layer in the second metal layers that is closest to the surface of the piezoelectric electrode is higher than the orientation degree in a layer in the second metal layers that is more apart from the surface of the piezoelectric electrode, the orientation degrees of the first metal layer and the second metal layer where stress applied is largest because of the closest proximity to the surface of the piezoelectric substrate are high, by which resistance to migration of each of the metal layers is improved.

As a result of the strengthened power handling capability of the first and the second metal layers that are closest to the surface of the piezoelectric substrate, as compared to a surface acoustic wave element using a conventional IDT electrode in which orientation degrees of the first and the second metal layer are not considered, a surface acoustic wave element having higher power handling capability can be realized.

Moreover, since the adherence between the second metal layers and the substrate is improved by the first metal layers, and the second metal layers are not directly in contact with the piezoelectric substrate, chemical reaction between the elements constituting the piezoelectric substrate and the second metal layers is suppressed, only little changes with time occur, so that a surface acoustic wave element that is excellent also in reliability can be realized.

When the first metal layers are formed of titanium or a titanium alloy, and the second metal layers are formed of aluminum or an aluminum alloy, it is needless to say that the power handling capability can be strengthened. In addition to this, it is possible to provide a surface acoustic wave element including an IDT electrode in which the adherence between the first metal layers and the piezoelectric substrate is good, and the first and second metal layers can be processed by RIE (Reactive Ion Etching) using chlorine-based gas, exhibiting good micro-processability. Further, no serious oxidation proceeds with time, thereby ensuring excellent reliability.

It is preferred that the thickness of a layer in the first metal layers that is closest to the surface of the piezoelectric substrate is 30 to 80 Å. In this case, since the first metal layer has a high orientation degree as well as good planarity, the formation of an IDT electrode with excellent power handling capability can be advantageously realized.

A surface acoustic wave element according to the present invention comprises: a piezoelectric substrate, an IDT electrode formed on the piezoelectric substrate having an electrode formed with at least one first metal layer comprising titanium or a titanium alloy, or chromium or a chromium alloy and a plurality of second metal layers comprising aluminum or an aluminum alloy, copper or a copper alloy, or gold or a gold alloy, the metal layers are alternately laminated, wherein the orientation degree in a layer in the second metal layers that is closest to the surface of the piezoelectric substrate is higher than the orientation degree in a layer in the second metal layers that is apart from the surface of the piezoelectric substrate.

In this surface acoustic wave element, as compared to a surface acoustic wave element using a conventional IDT electrode in which the orientation degree of the second metal layer is not considered, the orientation degree in a layer in the second metal layers where stress applied is largest because of the closest proximity to the surface of the piezoelectric substrate is high, and by the high orientation degree, the resistance to migration is improved. As a result, the power handling capability of the second metal layer is strengthened, so that a surface acoustic wave element having higher power handling capability can be realized. In addition, since the adherence between the second metal layers and the substrate is improved by the first metal layers, and the second metal layers are not directly in contact with the piezoelectric substrate, chemical reaction between the elements constituting the piezoelectric substrate and the second metal layers is suppressed and only little changes with time occur, so that a surface acoustic wave element that is excellent also in reliability can be realized.

It is preferred that the second metal layers include crystal grains that are continuously formed from a surface apart from the surface of the piezoelectric substrate to a surface close to the surface of the piezoelectric substrate.

Usually, when atoms of the material constituting an IDT electrode migrate to cause hillocks, the hillocks eventually come into contact with adjacent electrode fingers and hillocks grown from adjacent electrode fingers, which results in short circuit between the electrode fingers. As a result, the surface acoustic wave element is destructed. Since migration occurs intensely in crystal grain boundaries, the higher the density of the crystal grain boundaries, the higher the possibility of the occurrence of destruction.

In comparison to this, the surface acoustic wave element with this structure includes an IDT electrode comprising metal layers is formed on a piezoelectric substrate, the metal layers include crystal grains that are continuously formed to extend from a surface distant from the surface of the piezoelectric substrate to a surface close to the piezoelectric substrate, by which crystal grain boundaries where dangling bonds are present are not allowed to exist in larger amount on a principal surface in parallel to the piezoelectric substrate than in the film thickness direction. This reduces the density of crystal grain boundaries, and regions where hillocks are prone to generate. As a result, the power handling capability of the electrode fingers can be improved, so that a surface acoustic wave element having higher power handling capability can be realized.

It is preferred that crystal grains whose sizes in the direction along a principal surface of the piezoelectric substrate are larger than the thickness of the metal layer are present as many as possible. This reduces the density of crystal grain boundaries present in the thickness direction of the metal layers. As a result, regions where hillocks are prone to generate are reduced, so that the power handling capability of the electrode fingers can be improved, and therefore a surface acoustic wave element with higher power handling capability can be realized.

According to a communication device of the present invention, since a duplexer is configured with the foregoing surface acoustic wave element, the IDT electrode exerts high power handling capability even in the duplexer into which high electric power is input. It is therefore possible to provide a communication device with excellent reliability.

The foregoing and other advantages, features and effects of the present invention will be apparent from the following description of preferred embodiments with reference to the accompanying drawings.

DESCRIPTION OF THE REFERENCE SYMBOLS

Figure 1:
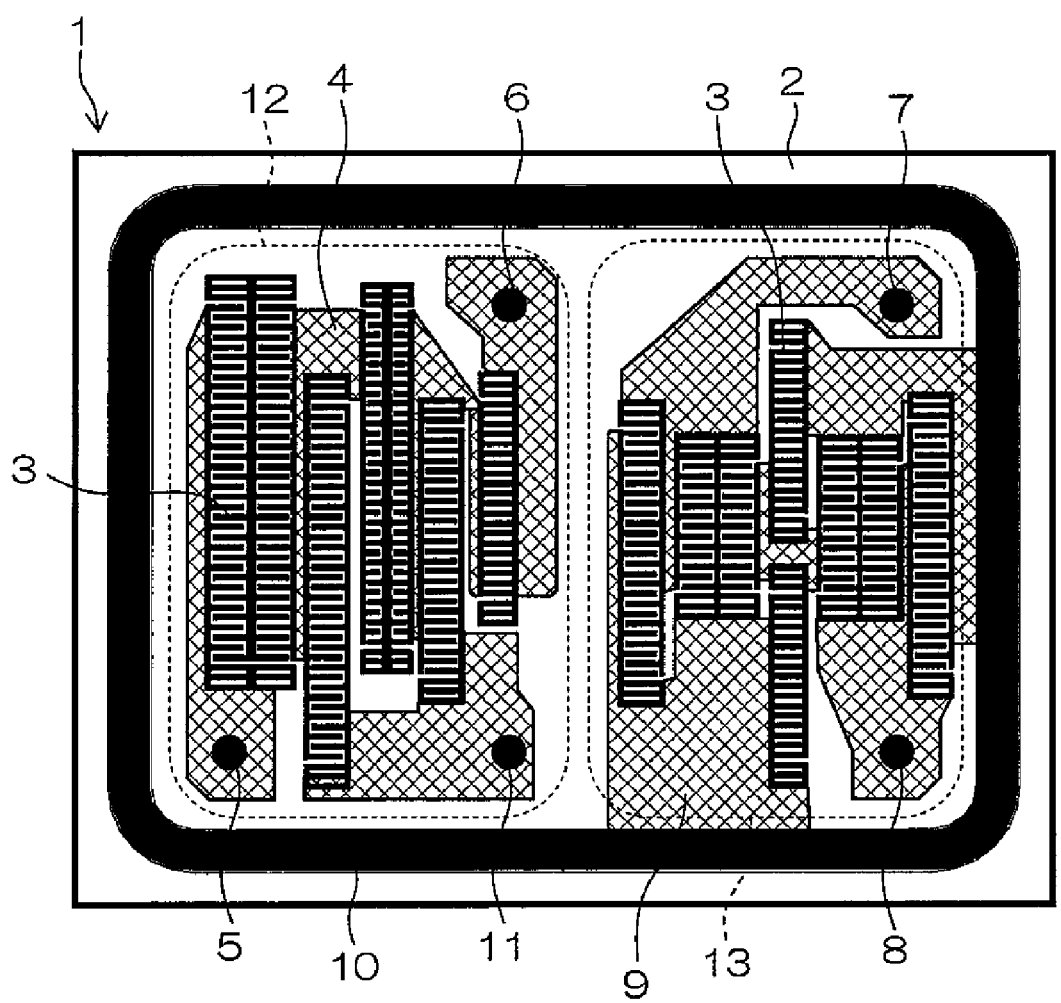
FIG. 1 is a plan view showing a principal surface of a piezoelectric substrate in the case of a duplexer (SAW-DPX) to which a surface acoustic wave element according to the present invention is applied.

1. Surface acoustic wave element
2. Piezoelectric substrate
3. IDT electrode
4. Connector electrode
5. Input pad section of transmitting side filter
6. Output pad section of transmitting side filter
7. Input pad section of receiving side filter
8. Output pad section of receiving side filter
9. Ground electrode
10. Circumferential electrode
11. Ground electrode pad section
12. Transmitting side filter area (Tx filter)

13. Receiving side filter area (Rx filter)
31a, 31b, 31c, 31b': First metal layers
32a, 32b, 32c, 32b': Second metal layers

BEST MODE FOR CARRYING OUT THE INVENTION

FIG. 1 is a plan view of a principal surface (which refers to the electrode forming surface, also referred to as "the surface" in the present specification) of a piezoelectric substrate of a surface acoustic wave element of the present invention that is applied to a duplexer (SAW-DPX).

A surface acoustic wave element 1 includes a transmitting side filter (Tx filter) area 12 (enclosed with broken lines) and a receiving side filter (Rx filter) area 13 (enclosed with broken lines) on a principal surface of a piezoelectric substrate 2.

As shown above, a compact SAW-PDX can be implemented by forming the Tx filter 12 and the Rx filter 13 on the same piezoelectric substrate 2 on the purpose of downsizing to realize an improved isolation characteristic.

Each of the filters 12, 13 is formed with a surface acoustic wave filter including a plurality of IDT electrodes 3 as exciting electrodes and connector electrodes 4 for connection among IDT electrodes 3. The IDT electrodes 3 have a plurality of long electrode fingers formed from bus bar electrodes arranged in parallel to each other in a direction perpendicular to the propagation direction of surface acoustic waves, each electrode 3 has a configuration with the electrode fingers being engaged with one another.

An input pad section of the Tx filter 12 is denoted by 5, an output pad section of the Tx filter 12 to be connected to an antenna is denoted by 6, an input pad section of the Rx filter 13 to be connected to the antenna is denoted by 7, and an output pad section of the Rx filter 13 is denoted by 8. In addition, the numeral 10 denotes a circumferential electrode in the form of a square frame that is formed so as to enclose the Tx filter 12 and Rx filter 13. The circumferential electrode 10 functions as an electrode for grounding surface acoustic wave filters by being connected to a circumferential electrode of a mounting board (not shown) by means of solder or the like. Together with that, it functions to seal the space between the piezoelectric substrate 2 and the mounting board. The numeral 9 denotes a ground electrode connected to the circumferential electrode 10.

In this surface acoustic wave element 1, each of the IDT electrodes of the Tx filter 12 and Rx filter 13 is disposed so that the propagation paths of surface acoustic waves do not overlap. That is, each of the IDT electrodes 3 of the Tx filter 12 and the Rx filter 13 is disposed parallel to the propagation paths of surface acoustic waves. Therefore, even when surface acoustic waves leak from the IDT electrode 3 of the Tx filter 12, the IDT electrode 3 of the Rx filter 13 will not receive them, thereby preventing the isolation characteristic from deteriorating.

A surface acoustic wave device is constructed by mounting the principal surface the piezoelectric substrate 2 described above to oppose to the upper surface of the mounting board.

Figure 2:
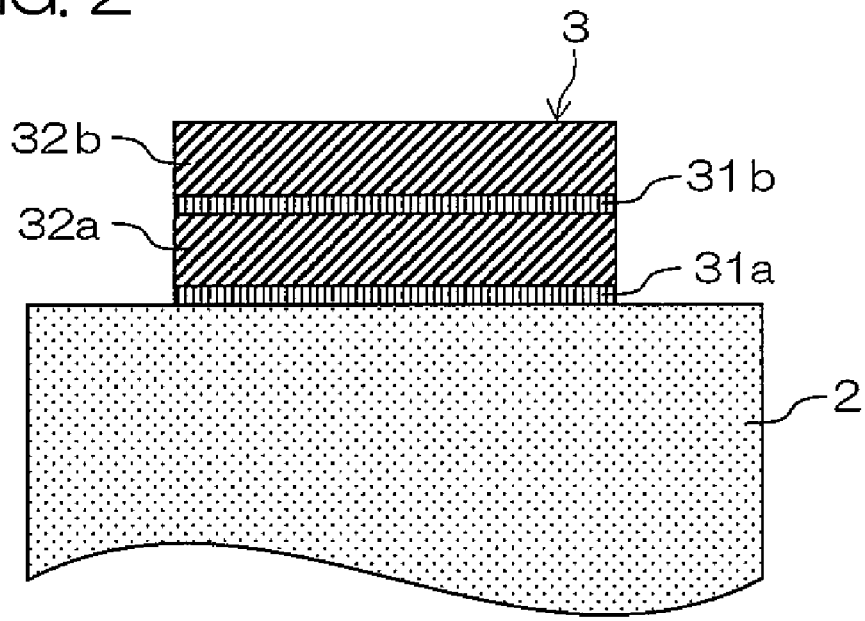
FIG. 2 is a cross-sectional view of one example of electrode finger of an IDT electrode.

FIG. 2 shows across-sectional view of one electrode finger of an IDT electrode 3 in a surface acoustic wave element according to the present invention.

In FIG. 2, a piezoelectric substrate is denoted by 2, for which single crystalline lithium tantalite, single crystalline lithium niobate or single crystalline lithium tetraborate may be used.

Parts denoted by 31a, 31b are first metal layers that comprise titanium or titanium alloy, or chromium or chromium alloy.

Parts denoted by 32a, 32b are second metal layers that comprise aluminum or aluminum alloy, copper or copper alloy, or gold or gold alloy.

The electrode finger of the IDT electrode 3 is constructed by laminating four layers including first metal layers 31a, 31b, and second metal layers 32a, 32b on the principal surface of the piezoelectric substrate 2 in the order of 31a, 32a, 31b, 32b.

For the titanium or the titanium alloy constituting the first metal layers 31a, 31b, so-called pure titanium or a titanium alloy in which at least one element selected from the group consisting of aluminum, copper, tin, zirconium, vanadium, nickel, cobalt, manganese, chromium, molybdenum, silicon, iron, carbon, nitrogen, and oxygen is added to titanium may be used. For chromium or chromium alloy, so-called pure chromium or a chromium alloy in which at least one element selected from the group consisting of molybdenum, iron, aluminum is added to chromium may be used.

Among these metals, in particular, when a titanium alloy or a chromium alloy including aluminum is used, first metal layers 31a, 31b including few defects can be obtained, so that the resistivity of the obtained first metal layers 31a, 31b can be lowered. Accordingly, insertion loss due to electrical resistance can be suppressed, and heat generation due to electrical resistance can also be suppressed. As a result, an IDT electrode with higher power handling capability can be realized.

For the aluminum or the aluminum alloy constituting the second metal layers 32a, 32b, so-called pure aluminum or an aluminum alloy in which at least one element selected from the group consisting of germanium, copper, palladium, silicon, lithium, scandium, gallium, hafnium, zinc, zirconium, titanium, and magnesium is added to aluminum may be used. For the copper or the copper alloy, so-called pure copper or a copper alloy in which at least one element selected from the group consisting of aluminum, zinc, tin, and nickel is added to copper may be used. For the gold or the gold alloy, so-called pure gold or a gold alloy in which at least one element selected from the group consisting of silver, copper, nickel, palladium, platinum, chromium, cobalt, manganese, and zinc is added to gold may be used.

Among these metals, when aluminum or an aluminum alloy is used, since the RIE process using chlorine-based gas is available, it is easy to perform micro-fabrication process for forming electrode fingers with a line width of about 1 μm or less.

In addition, referring to FIGS. 8 and 9 as later described, when the second metal layers 32a, 32b are of multicrystalline, since an aluminum alloy including a trace amount of copper or magnesium is more migration resistant than pure aluminum, an IDT electrode with higher power handling capability can be realized. Furthermore, when a copper alloy is used, adding aluminum to copper improves oxidization resistance, whereby an IDT electrode with further improved long-term reliability can be realized.

As described above, the material for the first metal layers 31a, 31b has a larger resistivity than that of the material for the second metal layers 32a, 32b.

In the embodiment of the present invention, the first metal layer 31a that is closest to the surface of the piezoelectric substrate 2 is formed so that the orientation degree thereof is higher than that of the upper first metal layer 31b. The "orientation degree" herein refers to "the degree of crystallite orientation to the same direction at a random cross section of a metal". The orientation degree can be quantified by a full-width at half-maximam (FWHM) of angle of diffraction in X-ray diffraction or electron diffraction.

Accordingly, the following advantages over conventional structures where the second metal layer 32a is formed without considering the orientation degree of the first metal layer 31a. That is, since disturbance of crystal lattice at the surface where the second metal layer 32a is in contact with the first metal layer 31a becomes small, the orientation degree of the second metal layer 32a immediately above the first metal layer 31a can be improved.

Because of the high orientation degree of the second metal layer 32a, the migration resistance of the second metal layer 32a is improved, which strengthens the power handling capability of the second metal layer 32a. It is therefore possible to realize a surface acoustic wave element having an IDT electrode with higher power handling capability.

Now, a manufacturing process of the IDT electrode 3 is described.

For the process for forming the first metal layers 31a, 31b and the second metal layers 32a, 32b on the piezoelectric substrate 2 sputtering, electron beam evaporation, ion beam sputtering or the like may be used.

For patterning of the first metal layers 31a, 31b and the second metal layers 32a, 32b that are formed on the piezoelectric substrate 2 into a predetermined configuration of IDT electrode, photolithography can be performed after the formation of the metal layers, then RIE, ion milling, or wet etching may be used. Alternatively, the patterning may be carried out such that a photoresist is formed on the surface of the piezoelectric substrate 2 prior to the formation of metal layers, and then photolithography is carried out to open a predetermined pattern, thereafter, the metal layers are formed, which may be followed by a lift-off process for removing the photoresist together with the metal layers formed in unwanted areas.

In order to make the orientation degree in the first metal layer 31a that is closest to the surface of the piezoelectric substrate 2 higher than the orientation degree in the upper first metal layer 31b, controlling the film forming rate, film formation pressure, substrate temperature during the film formation will serve the purpose. For example, the rate of formation of the first metal layer 31a may be increased.

The orientation degree in the first metal layers 31a, 31b can be evaluated by the breadth of diffraction angle, for example, half-width value of the diffraction angle obtained as a result of X-ray diffraction or electron diffraction.

As described above, in the embodiment of the present invention, the orientation degree in the first metal layer 31a that is closest to the surface of the piezoelectric substrate 2 is higher than the orientation degree in the upper first metal layer 31b, by which the orientation degree of the second metal layer 32a that is immediately above the first metal layer 31a can be made higher than the orientation degree of the upper second metal layer 32b. Accordingly, the migration resistance of the second metal layer 32a is improved, so that the power handling capability can be strengthened in the second metal layer 32a, and therefore the power handling capability of the IDT electrode can be enhanced.

while in the embodiment shown in FIG. 2, the thicknesses of the first metal layers 31a and 31b and the thicknesses of the second metal layers 32a and 32b are shown as generally the same, respectively, these may be different from each other.

Figure 3:
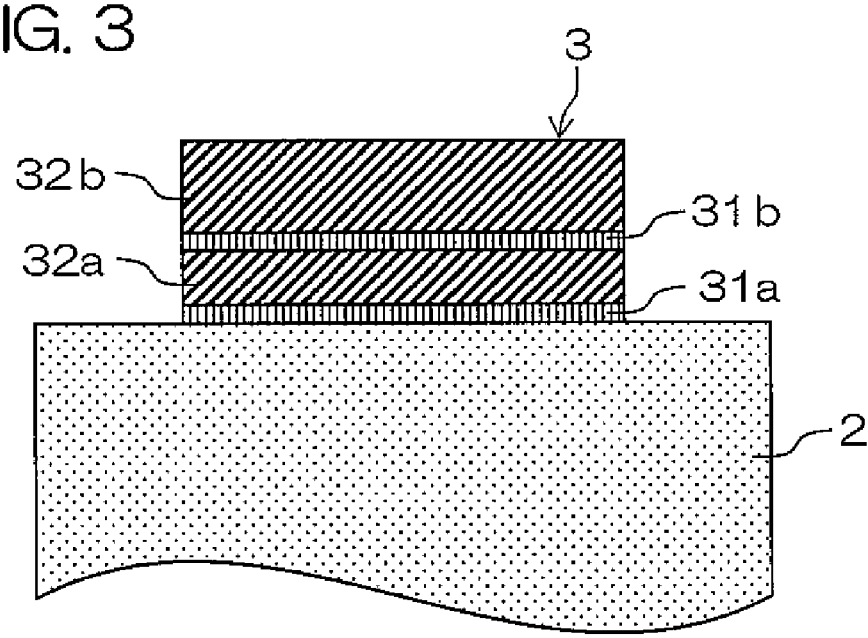
FIG. 3 is a cross-sectional view of another example of electrode finger of an IDT electrode.

FIG. 3 shows a cross-sectional view of an electrode finger of an IDT electrode 3. As shown in FIG. 3, the thickness of the second metal layer 32a that is closest to the surface of the piezoelectric substrate 2 is smaller than the thickness of the upper second metal layer 32b. In this case, since the second metal layer 32a is closer to the piezoelectric substrate 2 than the upper second metal layer 32b, larger stress is applied to the second metal layer 32a. Thining the thickness of the second metal layer 32a allows to reduce the crystal grain sizes in the thickness direction, so that the overall power handling capability of the IDT electrode as a whole can be further improved.

In the electrode structures described so far, by improving the orientation degree of the first metal layer 31a that is closest to the surface of the piezoelectric substrate 2, the orientation degree of the second metal layer 32a immediately above it is improved. However, the following structure may also be employed.

Although the cross-sectional view of the main part of the IDT electrode is similar to that of FIG. 2, the second metal layer 32a is formed so as to have a higher orientation degree than that of the upper second metal layer 32b in this structure.

In this embodiment, the orientation degree of the second metal layer 32a is improved by optimizing the conditions for forming the second metal layer 32a without considering the orientation degree of the first metal layer 31a.

In order to form the second metal layer 32a to have a high orientation degree, controlling the film forming rate, film forming pressure, or substrate temperature during the film forming will serve the purpose. For example, the rate of film forming of the second metal layer 32a may be increased.

Since the migration resistance can be enhanced by increasing the orientation degree, the power handling capability in the second metal layer 32a can be strengthened, so that the power handling capability of the IDT electrode can be enhanced.

Because the material used for the first metal layer 31a has a larger resistivity than that of the material for the second metal layer 32a, electric current flows mainly in the second metal layer 32a in the IDT electrode. In order to minimize the electrical resistance of the IDT electrode, the ratio of the second metal layer 32a of the IDT electrode is preferably as large as possible. Accordingly, improving the handling capability of the IDT electrode as a whole can be accomplished mainly by improving the power handling capability of the second metal layer 32a that is close to the piezoelectric substrate 2.

Thus, in comparison to conventional cases where the orientation degree of the second metal layers 32a, 32b are not considered, the orientation degree in the second metal layer 32a that is closest to the surface of the piezoelectric substrate 2 in the second metal layers 32a, 32b is improved better than the orientation degree in the upper second metal layer 32b. As a result, a surface acoustic wave element having an IDT electrode with higher power handling capability can be realized.

In the IDT electrodes described so far, the orientation degree of the first metal layer 31a or the second metal layer 32a that is closest to the surface of the piezoelectric substrate 2 is improved. However, the following structure may also be employed.

Although the cross-sectional view of the main part of the IDT electrode is similar to that in FIG. 1, the orientation degree herein of the first metal layer 31a closest to the surface of the piezoelectric substrate 2 is made higher than that of the upper first metal layer 31b, and at the same time, the second metal layer 32a is formed so that the orientation degree thereof is higher than that of the upper second metal layer 32b.

As a result of improving the orientation degree of the first metal layer 31a, it becomes easy to improve the orientation degree of the second metal layer 32a that is formed immediately above the first metal layer 31a, and high orientation degrees can be achieved under a wide range of film forming conditions.

Thus, in comparison to conventional cases where the orientation degrees of the first metal layers 31a, 31b and the second metal layers 32a, 32b are not considered, the orientation degrees in the first metal layer 31a and the second metal layer 32a that are closest to the surface of the piezoelectric substrate 2 can be improved, so that higher migration resistance can be achieved. As a result, a surface acoustic wave element having an IDT electrode with higher power handling capability can be realized.

As described so far, in the embodiments shown in FIGS. 2 and 3, titanium or titanium alloy is selected for the first metal layers 31a, 31b, and aluminum or aluminum alloy is selected for the second metal layers 32a, 32b to form the IDT electrode.

International Patent Application Publication No. 1999/54995 discloses an example of a similar structure to the embodiment shown in FIG. 2, in which titanium is used for the first metal layers 31a, 31b, and a ternary or more complex aluminum alloy simultaneously added with an element forming solid solution with aluminum, and an element that is precipitated in the grain boundaries or forms an intermetallic compound with aluminum is used for the lower second metal layer 32a, and for the upper second metal layer 32b, a binary aluminum alloy added with copper is used.

This is an example where a third element is added to the binary alloy used for the upper second metal layer 32b in the lower second metal layer 32a so that the power handling capability of the lower second metal layer 32a to which large stress is applied is improved because of its proximity to the piezoelectric substrate 2.

However, such a structure may require preparation of plurality of kinds of film forming materials for forming the respective layers.

For example, when film forming is carried out by sputtering, in the case of International Patent Application Publication No. 1999/54995, three kinds of targets including a titanium target, a ternary or more complex aluminum alloy target, (e.g. Al—Mg—Cu alloy target or the like), and a binary or more complex aluminum alloy target (e.g. Al—Cu alloy target or the like) are necessary. In order to form an IDT electrode using these materials, a large-scale sputtering apparatus capable of mounting at least three targets is required when mass productivity is considered.

In contrast to this, in order to form the IDT electrode of the surface acoustic wave element according to the present embodiment, one common material for both the first metal layers 31a and 31b and another common material for both the second metal layers 32a and 32b need to be prepared.

For mass production as well, it is sufficient to prove a sputtering apparatus capable of mounting at least two targets, resulting in easier and economical mass production.

It is known that, in the case of an aluminum alloy, as the amounts of additive elements increase, the power handling capability is improved, while the resistivity becomes larger. However, according to the present invention, since it is not particularly necessary to increase the amounts of additive elements, such inconvenience as increased resistivity does not arise.

In the surface acoustic wave element according to the present invention, resistivity can be reduced by improving the orientation degree of the metal layers in the IDT electrode. A description will be given of this reduction of resistivity with reference to FIG. 4.

Figure 4:
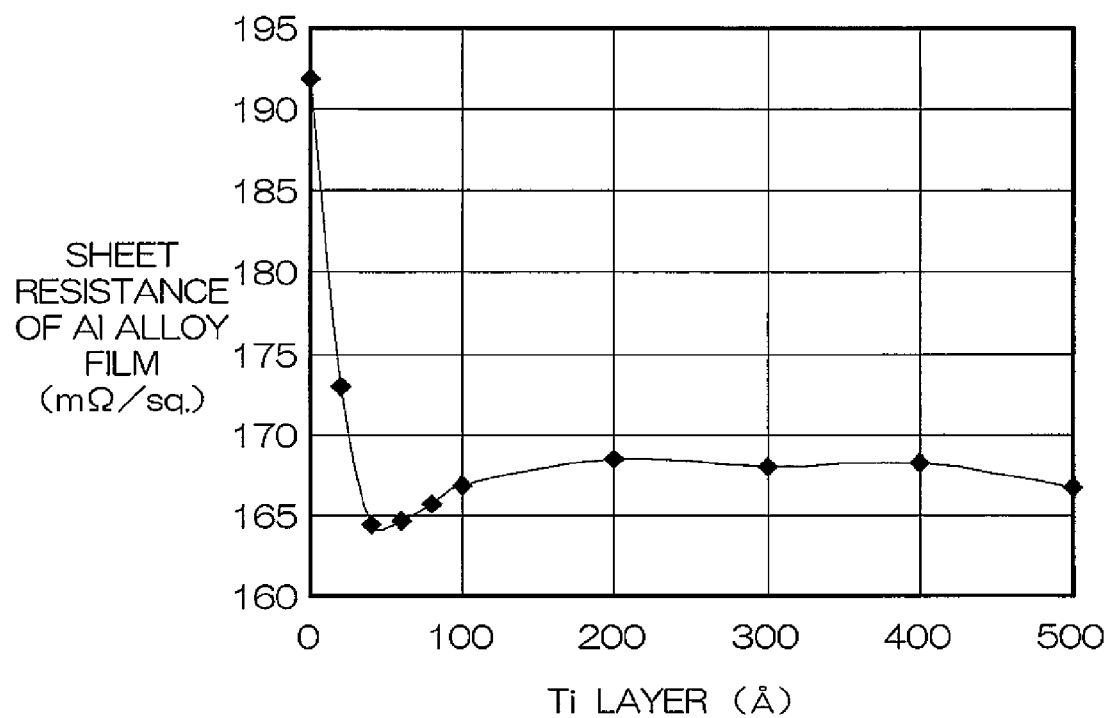
FIG. 4 is a line chart showing a change of sheet resistance in the case where a second metal layer comprising aluminum alloy including 1% by mass of copper, and having a thickness of 2000 Å is formed on first metal layers comprising titanium in different thicknesses.

FIG. 4 is a line chart showing a change of sheet resistance value of a second metal layer formed such that a first metal layer comprising titanium is formed on a piezoelectric substrate by varying the thickness thereof in the range of 0 to 500 Å and a second metal layer comprising an aluminum alloy film in which 1% by mass of copper is added to aluminum is formed thereon to have a thickness of 2000 Å.

In FIG. 4, the horizontal axis represents thickness [Ti layer thickness] (unit: Å) of the first metal layer comprising titanium, and the vertical axis represents sheet resistance [sheet resistance of Al alloy film] (unit:mΩ/sq.) of the second metal layer comprising an aluminum alloy, and the black points and a characteristic curve represent changes in the sheet resistance value of the Al alloy film.

As is apparent from the result shown in FIG. 4, the sheet resistance of the aluminum alloy film is extremely high in the region where the Ti layer thickness is less than 30 Å. The Sheet resistance is extremely small where the Ti layer thickness is in the range of 30 to 80 Å, and generally constant at values in a certain range where the Ti layer thickness exceeds 80 Å.

In addition, when the orientation degree in the aluminum alloy film of the sample of this experiment is evaluated using X-ray diffraction, the crystal orientation of the aluminum alloy film is almost random where the Ti layer thickness is less than 30 Å.

However, where Ti layer thickness is in the range of 30 to 500 Å, (111) planes of the crystal orientation are found oriented in one direction. In particular, where the Ti layer thickness is 30 to 80 Å, the FWHM at the peak indicating the (111) plane of the crystal orientation of the aluminum alloy film is small. That is, orientation degree in the aluminum alloy film is verified high when the Ti layer thickness is 30 to 80 Å.

It is apparent from these results that there is correlation between the orientation degree and the sheet resistance of the aluminum alloy film.

Moreover, according to the structure of IDT electrode in the surface acoustic wave element of the present invention, the resistance of the IDT electrode can be reduced by improving the orientation degree of the second metal layer 32a. Since low resistance reduces the magnitude of heat generation due to the resistance, higher power handling capability can be achieved.

From the results of the experiments above, the first metal layers 31a, 31b of the metal layers constituting the IDT electrode are formed of titanium or titanium alloy, and the second metal layers 32a, 32b are formed of aluminum or aluminum alloy in the surface acoustic wave element of the present invention, the following is found:

That is, when the thickness of the first metal layer 31a in the first metal layers 31a, 31b that is closest to the piezoelectric substrate 2 is less than 30 Å, the first metal layer 31a is formed as a discontinuous film in the shape of islands, which tends to make it impossible to improve the orientation degree of the second metal layer 32a located immediately above the first metal layer 31a.

Therefore, the thickness of the first metal layer 31a that is closest to the piezoelectric substrate 2 in the first metal layers 31a, 31b is preferably 30 to 80 Å.

In addition, when the thickness of the first metal layer 31a exceeds 80 Å, crystal grains constituting the first metal layer 31a grow so that the planarity of the upper surface of the first metal layer 31a is deteriorated, which tends to make it impossible to improve the orientation degree of the second metal layer 32a immediately above the first metal layer 31a.

Therefore, the thickness of the first metal layer 31a that is closest to the piezoelectric substrate 2 in the first metal layers 31a, 31b is preferably 30 to 80 Å.

While increasing the amounts of additive elements included in an aluminum alloy tends to cause etching residue remained during the processing by RIE, since there is no need to increase the amounts of elements added to aluminum or an aluminum alloy in the case of IDT electrode in the surface acoustic wave element of the present invention, such problem will not arise. Therefore, it is possible to form an IDT electrode with a desired configuration by precise micro-fabrication process.

Figure 5:
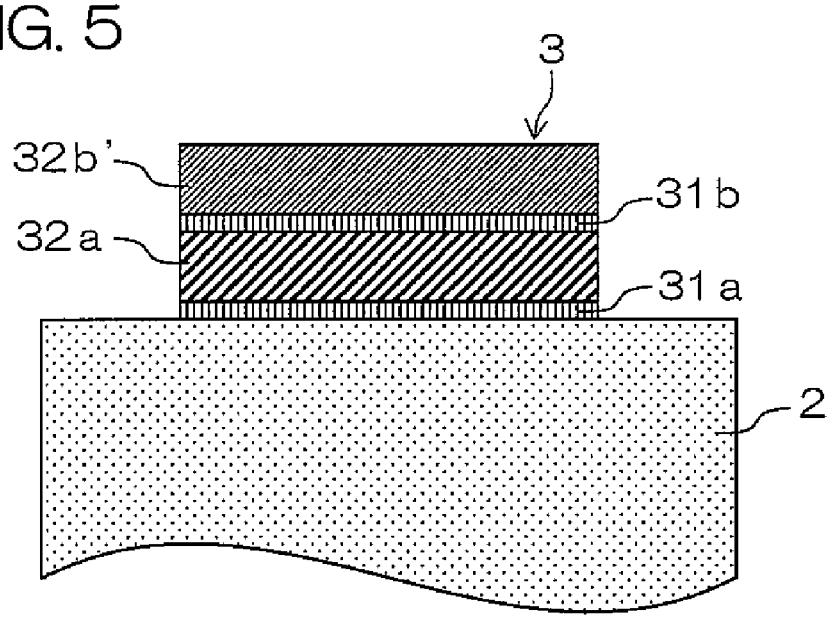
FIG. 5 is a cross-sectional view of a still another example of electrode finger of an IDT electrode.

The materials may be modified as follows:

As the cross-sectional view in FIG. 5 shows, the materials for the second metal layer 32a closest to the piezoelectric substrate 2 and the upper second metal layer 32b' may change the materials. One example of such modifications is the combination of the second metal layer 32a using an aluminum alloy including magnesium and the second metal layer 32b' using an aluminum alloy including copper.

Although an alloy including aluminum added with magnesium has good migration resistance, since magnesium is more easily oxidized than aluminum under circumstances where oxygen is present, the added magnesium coagulates on the surface (the interface between the electrode film and the atmosphere including oxygen) to form a solid oxide film. Therefore, when an extracting electrode for connecting the IDT electrode and an external electrode is formed using the same material as that of the IDT electrode, on which a laminated body including chromium, aluminum, gold or the like for bump forming and wire bonding is laminated, the adherence of the interface between the laminate and the aluminum alloy including magnesium is deteriorated, causing the contact resistance to increase.

However, such problem can be avoided using a material free from magnesium for the second metal layer 32b' as this example.

Figure 6:
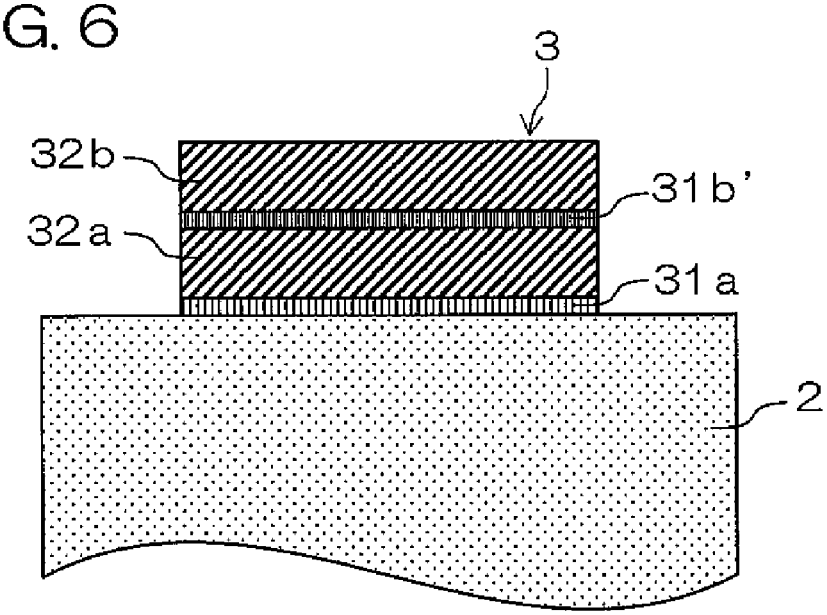
FIG. 6 is a cross-sectional view of an yet another example of electrode finger of an IDT electrode.

In addition, as the cross-sectional view in FIG. 6 shows, the material for the first metal layer 31a closest to the piezoelectric substrate 2 and the material for the upper first metal layer 31b' may change the materials. One example of such modifications is the combination of the first metal layer 31a using titanium or titanium alloy and the upper first metal layer 31b' using chromium or chromium alloy.

Since chromium has a lower resistivity than titanium, using chromium is preferable for reducing the overall resistance of the IDT electrode. However, when the IDT electrode is processed by RIE using chlorine-base gas, the etching rate of chromium is extremely slower than that of titanium. For this reason, when a metal layer with a certain degree of thickness distribution within the surface of the piezoelectric substrate 2 is etched, in etching the first metal layer 31a immediately above the piezoelectric substrate 2 throughout the area within the entire surface of the piezoelectric substrate 2, etching of portions with small thickness is completed earlier, and by the time when the area on the entire surface of the piezoelectric substrate 2 is etched, the portions have been significantly overetched, which sometimes causes a phenomenon to damage the piezoelectric substrate 2 itself.

Therefore, by forming the first metal layer 31a using titanium as this example, the damage to the piezoelectric substrate 2 can be relatively reduced.

Now a case where the metal constituting the IDT electrode is of multicrystalline is described.

Figure 7:
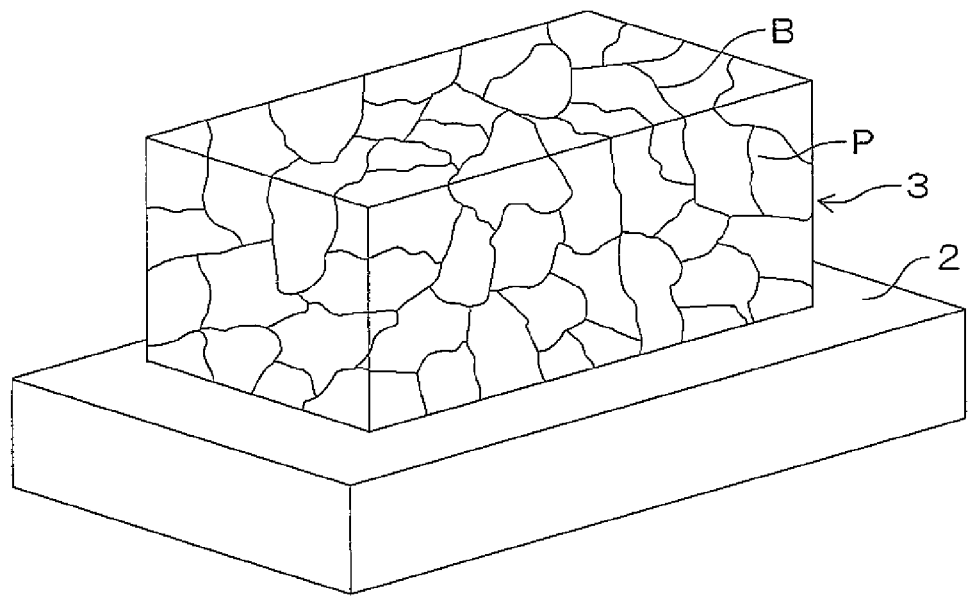
FIG. 7 is a perspective view showing a conventional crystal structure of electrode finger of an IDT electrode.

FIG. 7 herein illustrates the crystal structure of an IDT electrode of a conventional surface acoustic wave element, where only one electrode finger is shown.

The IDT electrode 3 is formed of large and small crystal grains P of a metal, and the grain sizes thereof become greater as the location nears the surface of the IDT electrode 3. There are numerous crystal grain boundaries B present continuously in a web from the interface between the piezoelectric substrate 2 and IDT electrode 3 to the surface of the IDT electrode 3.

As described earlier, migration of metal atoms is prone to occur when there are many dangling bonds at the crystal grain boundaries B, therefore the energy required for movement of atoms can be small.

In the structure of FIG. 7, since a greater number of crystal grain boundaries B where migration is prone to occur are present in the direction parallel to the surface of the piezoelectric substrate 2 than the thickness direction of the IDT electrode 3, the metal atoms that move along these crystal grain boundaries B in the principal surface direction to the side surfaces of the IDT electrode 3 cause hillocks to generate, which is a factor that deteriorates the power handling capability of the IDT electrode 3.

Figure 8:
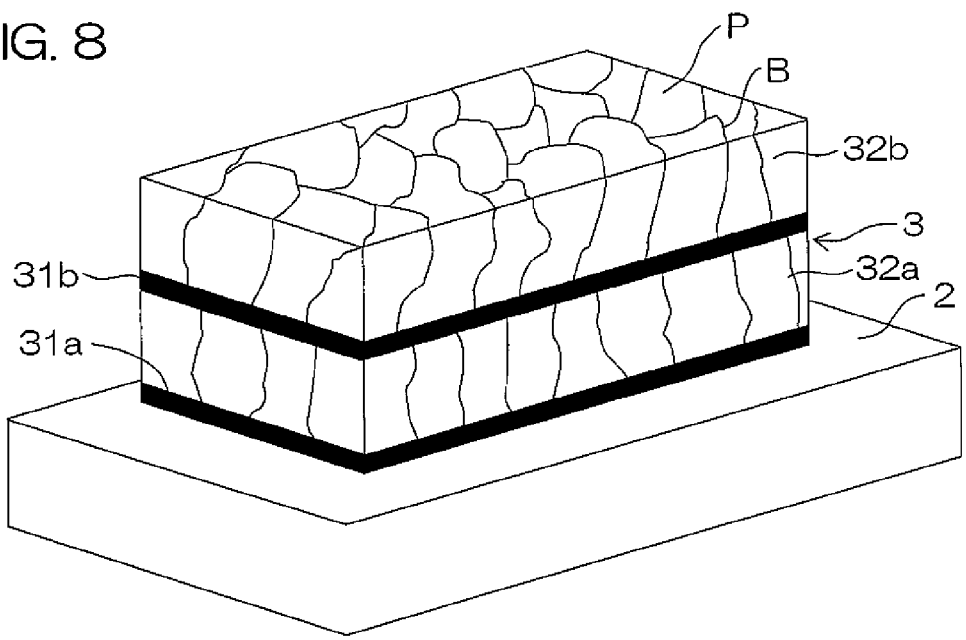
FIG. 8 is a perspective view showing one example of the crystal structure of electrode finger of an IDT electrode.

In comparison to this, the crystal structure of an IDT electrode in a surface acoustic wave element of the present invention is shown in FIG. 8.

As shown in FIG. 8, crystal grains P are formed in the second metal layers 32a, 32b continuously from the upper surface to the lower surface thereof. While the respective metal layers 32a, 32b are formed including numerous multi-crystalline metal grains similarly to the conventional surface acoustic wave element, the shapes of the crystal grains P are different from the conventional ones.

That is, crystal grains P are grown into columnar shapes to reach the upper surface of the second metal layer 32a with the sizes being kept the same as those in regions immediately above the piezoelectric substrate 2 in the second metal layer 32a.

In the second metal layer 32b as well, crystal grains P are grown from the lower surface to the upper surface of the second metal layer 32b into columnar shapes.

While this crystal structure includes crystal grain boundaries B where migration is prone to occur, because of the structure of aligned columnar crystal grains P, the density of the crystal grain boundaries B that continue from the interior to the side surfaces of the IDT electrode 3 is low.

Thus, the metal atoms moving from the interior of the IDT electrode 3 along the crystal grain boundaries B to the side surfaces thereof are reduced, and as a result, generation of hillocks can be reduced, thereby improving the power handling capability.

In addition, while as a major factor causing electrical resistance of a metal layer, scattering of electrons due to crystal grain boundaries B can be recited, since crystal grains P constitute a columnar crystal structure in the IDT electrode 3, the density of the crystal grain boundaries B can be reduced, and the electrical resistance can also be reduced as compared to the IDT electrode in a conventional surface acoustic wave element. This can reduce of insertion loss within the passband caused by electrical resistance of the surface acoustic wave element and heat generation due to the electrical resistance that may be a factor to shorten the duration of the power handling capability. As a result, higher power handling capability can be obtained.

In order to form the crystal structure of the IDT electrode 3 including columnar crystal grains P grown from the lower surface to the upper surface in the thickness direction thereof, the film forming rate, film forming pressure, and substrate temperature during the film forming may be optimized by controlling them, for example, by increasing the input power to plasma during the film forming than that in a conventional case to increase the film forming rate or the like.

Evaluation of such a crystal structure in the IDT electrode 3 can be performed, for example, by observations through a transmission electron microscope.

Figure 9:
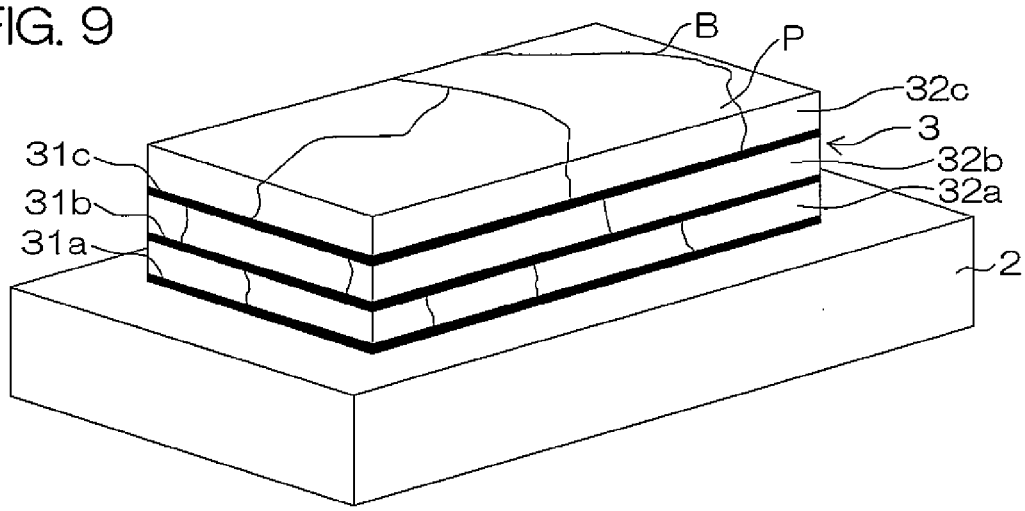
FIG. 9 is a perspective view showing another example of the crystal structure of electrode finger of an IDT electrode.

FIG. 9 shows another embodiment of the IDT electrode of the surface acoustic wave element according to the present invention in illustration diagram.

The embodiment in FIG. 8 is one where the crystal grains P constituting the metal layers of the IDT electrode 3 are formed into the columnar shapes extending from the lower surfaces to the upper surfaces of the metal layers.

However, in order to further improve power handling capability, the structure of FIG. 9 is arranged such that a large number of crystal grains P are present whose sizes are larger in a direction parallel to the principal surface of the piezoelectric substrate than in the thickness direction of the metal layers to occupy the major part.

Here, "to occupy the major part" means that the sum of the volumes of crystal grains in a metal layer that have larger sizes in a direction parallel to the principal surface of the piezoelectric substrate than in the thickness direction of the metal layer is larger than the sum of the volumes of crystal grains that have smaller sizes in a direction parallel to the principal surface of the piezoelectric substrate than in the thickness direction of the metal layer. If there are no crystal grains having smaller sizes in a direction parallel to the principal surface of the piezoelectric substrate than in the thickness direction of the metal layers, it reaches a state where there are the largest number of crystal grains having larger sizes in a direction parallel to the principal surface of the piezoelectric substrate than in the thickness direction of the metal layers.

By the arrangement in which the metal layers include a large number of crystal grains P having larger sizes in the direction of the principal surface of the piezoelectric substrate than in the thickness direction, the density of the crystal grain boundaries B where migration is prone to occur can be reduced, and the power handling capability can be further improved.

In the embodiment shown in FIG. 9, two second metal layers 32b, 32c are inserted as intermediate layers among first metal layers 31a, 31b, 31c. In other words, the structure consists of six metal layers in total including three first metal layers and three second metal layers.

The total number of laminated metal layers in the IDT electrode is not limited to four, but the laminate may be a 5-layer-structure further laminating a first metal layer, or a 6-layer-structure alternately laminating second metal layer formed thereon as this embodiment. In cases where the same materials are used to form an IDT electrode with almost the same thickness, the number of layers is preferably large and the crystal grain sizes of the respective layers are preferably small so that the migration resistance can be increased.

However, since as the ratio of the first metal layers to the thickness of the entire IDT electrode increases, the electrical resistance of the IDT electrode increases. Accordingly, insertion loss is increased and heat generation due to the resistance becomes more intense, resulting in degraded power handling capability. Therefore, there exists an upper limit of the preferred number of layers.

When the total number of the first and the second metal layers in the IDT electrode is six as in FIG. 9, a surface acoustic wave element having an IDT electrode can be provided with excellent power handling capability, relatively low electrical resistance, good characteristics, and high reliability, which permits relatively easy micro-fabrication process.

Hereinafter, an embodiment of a communication device according to the present invention will be described taking a cellular phone as an example.

In a communication device comprising either one or both of a receiving circuit and a transmitting circuit, a surface acoustic wave element of the present invention can be used as a bandpass filter of a duplexer included in the circuits.

Figure 10:
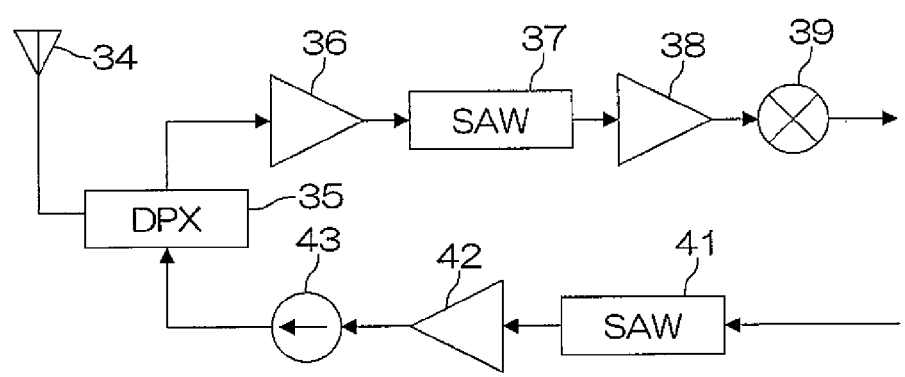
FIG. 10 is a block circuit diagram of a radio frequency circuit of a cellular phone including a surface acoustic wave element according to the present invention as a duplexer.

FIG. 10 is a block circuit diagram of a radio frequency circuit in a cellular phone.

Radio frequency signals transmitted from a cellular phone pass through a surface acoustic wave element 41, where unwanted signals are removed, the signals are amplified by a power amplifier 42, then pass through a duplexer 35 including an isolator 43 and a surface acoustic wave element of the present invention and radiated from an antenna 34.

The radio frequency signals received by the antenna 34 are separated by the duplexer 35 including the surface acoustic wave element of the present invention, and amplified by a low noise amplifier 36, and after unwanted signals thereof are removed by a surface acoustic wave filter 37, the signals are amplified again by an amplifier 38 and converted into low of Cu (second metal layer 32a)/Ti (first metal layer 31b)/Al and 1% by mass of Cu (second metal layer 32b) by sputtering. The thicknesses of the layers were 6 nm/209 nm/6 nm/209 nm, respectively.

The film forming were carried out under optimized conditions where the plasma input power was increased and the film forming rate was increased from those in conventional cases so that the orientation degrees of the Ti layer (first metal layer 31a) immediately above the piezoelectric substrate 2 and the Al and 1% by mass of Cu layer (second metal layer 32a) immediately above the Ti layer were improved.

To describe specifically, the film forming conditions in the present example were as follows: Ar flow rate of 100 sccm; film forming pressure of 0.25 Pa; input power of 800 W during the film forming of Ti layer; input power of 3 kW during the forming of Al—Cu layer. However, since the optimum values of the forming conditions largely depend on the apparatus and the use situations of the targets, these forming conditions are not invariant, but the optimum conditions need to be determined in accordance with the forming apparatus for use and the conditions inside the apparatus. In the present example, while the first metal layers 31a, 31b and the second metal layers 32a, 32b were formed under the same conditions, respectively, since the respective deposition conditions were optimized for the first metal layer 31a and the second metal layer 32a, the frequency signals by a mixer 39.

As described above, by applying the surface acoustic wave element of the present invention that includes an IDT electrode with high power handling capability and high reliability to the duplexer 35 into which radio frequency signals with high electric power are input, a communication device of the present invention can be provided with high power handling capability and high reliability.

It should be understood that the present invention is not limited to the foregoing embodiments, but various modifications may be made without departing from the spirit of the present invention.

For example, while the embodiment shown in FIG. 1 is one that includes radar-type filters, the present invention does not limit the filter structure, but DMS-type filters or IIDT-type filters may also be used. In addition, the arrangement of the input and output pads are not limited to that shown in FIG. 1, but may be such that input and output pads are disposed on diagonal lines on the piezoelectric substrate.

EXAMPLE 1

On a principal surface of a piezoelectric substrate 2 (with a thickness of 250 μm) comprising a 38.7° rotated, Y-cut, X-propagation single crystalline lithium tantalite, four conductive layers were formed including, in the order from the substrate side, Ti (first metal layer 31a)/Al and 1% by mass orientation degrees of the first metal layer 31a and the second metal layer 32a were higher than those of the first metal layer 31b and the second metal layer 32b as later described.

Subsequently, these conductive layers were subjected to patterning by photolithography and RIE so as to form a large number of surface acoustic wave element areas, each including a transmitting side filter area 12 and a receiving side filter area 13 that have IDT electrodes 3, input pad sections 5, 7 and output pad sections 6, 8 and a circumferential electrode 10 as shown in FIG. 1. The etching gas used herein was a gas mixture of $BCl_3$ and $Cl_2$. The line widths of electrode fingers constituting the IDT electrodes 3 and the distance between adjacent electrode fingers were both about 1 μm.

New conductive layers comprising Cr/Ni/Au were laminated over the input pad sections 5, 7, output pad sections 6, 8, the ground electrode pad section 11 and the circumferential electrode 10 so as to form input pads and output pads on the input pad sections 5, 7, the output pad sections 6, 8, and the ground electrode pad section 11, respectively. The thicknesses of these new conductive layers were 10 nm/1000 nm/100 nm, respectively. The circumferential electrode 10 was provided for hermetically sealing the surface acoustic wave element 1.

Subsequently, the piezoelectric substrate 2 was separated by dicing into individual surface acoustic wave element areas to obtain a large number of surface acoustic wave elements 1. The IDT electrodes 3 of the produced surface acoustic wave elements 1 were subjected to the FIB (Focused Ion Beam) process to produce thin piece samples, and the orientation degrees of the respective layers of the IDT electrodes 3 were investigated by electron diffraction. As a result, it is verified that the orientation degrees of the Ti layer (first metal layer 31a) and the Al and 1% by mass of Cu layer (second metal layer 32a) immediately above the Ti layer were higher than the orientation degrees of the Ti layer (first metal layer 31b) and Al and 1% by mass of Cu layer (second metal layer 32b) that are laminated on the respective lower layers. In addition, the IDT electrodes 3 were subjected to the FIB (Focused Ion Beam) process to produce cross sections thereof, and the cross sections were analyzed using EBSD (Electron Back Scatter Diffraction), the results of which also showed similar difference in orientation degree.

As comparative example, the same materials were used to form IDT electrodes of surface acoustic wave elements, in which orientation degrees of the metal layers were not considered as in the conventional cases, and similar evaluations were performed. It was revealed that the orientation degrees of the Ti layer (first metal layer 31a) and the Al and 1% by mass of Cu layer (second metal layer 32a) immediately above the Ti layer were almost at the same level as the orientation degrees of the Ti layer (first metal layer 31b) and the Al and 1% by mass of Cu layer (second metal layer 32b) that are laminated on the respective lower layers, and they were almost at the same level as the orientation degrees of the upper Ti layer (first metal layer 31b) and the Al and 1% by mass of Cu layer (second metal layer 32b) immediately above it in the foregoing example according the present invention.

Subsequently, surface acoustic wave elements 1 of the example of the present invention and the comparative example were mounted on a mounting board comprising a LTCC (Low Temperature Co-fired Ceramics) substrate with the respective principal surfaces being opposed thereto.

The LTCC substrate herein included a base side circumferential electrode corresponding to the circumferential electrode 10 formed on the principal surface of the piezoelectric substrate 2, and pad electrodes connected to the input and output pads of the surface acoustic wave element 1, and solder was preliminarily printed on these base side circumferential electrode and the pad electrodes. Mounting of the surface acoustic wave elements 1 thereon was carried out such that each surface acoustic wave element 1 was disposed so as to coincide with these solder patterns, which was tentatively fixed by application of ultrasonic waves, and thereafter, the solder was melted by heating, thereby connecting the circumferential electrode 10 to the base side circumferential electrode, and input and output pads to the pad electrodes. Thus, the IDT electrodes 3 of the surface acoustic wave element 1 and the input and output pads were completely hermetically sealed by the base side circumferential electrode of the LTCC substrate and the circumferential electrode 10 connected thereto. The step of mounting the surface acoustic wave elements 1 was carried out in a nitrogen atmosphere.

Then, resin molding was carried out to protect the other principal surface (back surface) of the surface acoustic wave element 1 with a molding resin, and in the last step, the mounting board was diced into individual surface acoustic wave elements 1 to obtain surface acoustic wave device of the example according to the present invention and that of the comparative example.

The electric properties of the example of the present invention and the comparative example produced in the foregoing way were evaluated. Although the both achieved almost the same level of properties, the example of the present invention had a somewhat smaller insertion loss. In addition, a power handling capability test revealed that when the same electric power at the same frequency was applied in the same atmospheric temperature, the example of the present invention had a life about four times larger that of the comparative example, which verified that a significant improvement was achieved in the example of the present invention.

EXAMPLE 2

On a principal surface of a piezoelectric substrate 2 (with a thickness of 25 μm) comprising 38.7° rotated, Y-cut, X-propagation single crystalline lithium tantalite, a metal layer composed of Al and 1% by mass of Cu by sputtering. The thickness of the layer was 390 nm. The forming was carried out with conditions optimized by increasing the plasma input power and the film forming rate from those in a conventional case so that each one of crystal grains continuously grows in the thickness direction of the metal layer from the upper surface to the lower surface.

The film forming conditions in the present example were as follows: Ar flow rate of 100 sccm; film forming pressure of 0.25 Pa; input power of 800 W during the forming of Ti layer; input power of 3 kW during the forming of Al—Cu layer. However, since the optimum values of the forming conditions largely depend on the apparatus and the use situations of the targets, these forming conditions are not invariant, but the optimum conditions need to be determined in accordance with the forming apparatus for use and the conditions inside the apparatus.

Subsequently, these conductive layers were subjected to patterning by photolithography and RIE so as to form a large number of surface acoustic wave element areas, each including a transmitting side filter area 12 and a receiving side filter area 13 that have IDT electrodes 3, input pad sections 5, 7 and output pad sections 6, 8 and a circumferential electrode 10 as shown in FIG. 1. The etching gas used herein was a gas mixture of $BCl_3$ and $Cl_2$. The line widths of electrode fingers constituting the IDT electrodes 3 and the distance between adjacent electrode fingers were both about 1 μm.

New conductive layers comprising Cr/Ni/Au were laminated over the input pad sections 5, 7, output pad sections 6, 8, the ground electrode pad section 11 and the circumferential electrode 10 so as to form input pads and output pads on the input pad sections 5, 7, the output pad sections 6, 8, and the ground electrode pad section 11, respectively. The thicknesses of these new conductive layers were 10 nm/1000 nm/100 nm, respectively. The circumferential electrode 10 was provided for hermetically sealing the surface acoustic wave element 1.

Subsequently, the piezoelectric substrate 2 was separated by dicing into individual surface acoustic wave element areas to obtain a large number of surface acoustic wave elements 1. The IDT electrodes 3 of the produced surface acoustic wave elements 1 were subjected to the FIB (Focused Ion Beam) process to produce thin piece samples, and the shape of crystal grains P constituting the IDT electrodes 3 were investigated by observations through a transmission electron microscope. The results showed that in the metal layers comprising Al and 1% by mass of Cu on the piezoelectric substrate 2, each one of the crystal grains was grown continuously in the thickness direction of the metal layer from the upper surface to the lower surface. This resembled the crystal structure illustrated in FIG. 8.

As a comparative example, the same materials were used to form IDT electrodes of surface acoustic wave elements, in which the shape of crystal grains was not considered as in the conventional cases, and similar evaluations were performed. It was revealed that in the metal layers comprising Al and 1% by mass of Cu on the piezoelectric substrate 2, crystal grain boundaries B were continuously present as a large number of webs from the interface between the piezoelectric substrate 2 and the IDT electrode 3 to the surface of the IDT electrode 3, and the crystal grain sizes were larger according to the proximity to the surface of the IDT electrode 3. This resembled the crystal structure illustrated in FIG. 7.

Subsequently, surface acoustic wave elements 1 of the example of the present invention and surface acoustic wave elements of the comparative example, each mounted on a mounting board comprising a LTCC (Low Temperature Co-fired Ceramics) substrate with the respective principal surfaces being opposed thereto.

The LTCC substrate herein included a base side circumferential electrode corresponding to the circumferential electrode 10 formed on the principal surface of the piezoelectric substrate 2, and pad electrodes connected to the input and output pads of the surface acoustic wave element 1, and solder was preliminarily printed on these base side circumferential electrode and the pad electrodes. Mounting of the surface acoustic wave elements 1 thereon was carried out such that each surface acoustic wave element 1 was disposed so as to coincide with these solder patterns, which was tentatively fixed by application of ultrasonic waves, and thereafter, the solder was melted by heating, thereby connecting the circumferential electrode 10 to the base side circumferential electrode, and input and output pads to the pad electrodes. Thus, the IDT electrodes 3 of the surface acoustic wave element 1 and the input and output pads were completely hermetically sealed by the base side circumferential electrode of the LTCC substrate and the circumferential electrode 10 connected thereto. The step of mounting the surface acoustic wave elements 1 was carried out in a nitrogen atmosphere.

Then, resin molding was carried to protect the other principal surface (back surface) of the surface acoustic wave element 1 with a molding resin, and in the last step, the mounting board was diced into individual surface acoustic wave elements 1 to obtain surface acoustic wave device of the example according to the present invention and that of the comparative example.

The electric properties of the example of the present invention and the comparative example produced in the foregoing way were evaluated. Although the both achieved almost the same level of properties, the example of the present invention had a somewhat smaller insertion loss. In addition, a power handling capability test revealed that when the same electric power (2 W) of the same frequency (the center frequency in the passband) was applied in the same atmospheric temperature (50° C.), the example of the present invention had a life (duration of time until the destruction of the IDT electrode) is improved about ten times longer that of the comparative example, which verified that a significant improvement was achieved in the example of the present invention.

What is claimed is:

1. A surface acoustic wave element comprising:
   a piezoelectric substrate; and
   an IDT electrode formed on the piezoelectric substrate having an electrode formed with a plurality of first metal layers comprising titanium or a titanium alloy, or chromium or a chromium alloy, and at least one second metal layer comprising aluminum or a aluminum alloy, copper or a copper alloy, or gold or a gold alloy, the metal layers alternately laminated one by one,
   wherein an orientation degree in a layer in the first metal layers that is closest to a surface of the piezoelectric substrate is higher than the orientation degree in a layer in the first metal layers that is apart from the surface of the piezoelectric substrate.

2. The surface acoustic wave element according to claim 1, wherein the surface acoustic wave element includes a plurality of the second metal layers, and the orientation degree in a layer in the second metal layers that is closest to a surface of the piezoelectric substrate is higher than the orientation degree in a layer in the second metal layers that is apart from the surface of the piezoelectric substrate.

3. The surface acoustic wave element according to claim 1, wherein the first metal layers comprise titanium or a titanium alloy, and the second metal layer comprises aluminum or an aluminum alloy.

4. The surface acoustic wave element according to claim 3, wherein the layer in the first metal layers that is closest to the surface of the piezoelectric substrate has a thickness of 30 to 80 Å.

5. A surface acoustic wave element comprising:
   a piezoelectric substrate; and
   an IDT electrode formed on the piezoelectric substrate having an electrode formed with at least one first metal layer comprising titanium or a titanium alloy, or chromium or a chromium alloy, and a plurality of second metal layers comprising aluminum or an aluminum alloy, copper or a copper alloy, or gold or a gold alloy, the metal layers alternately laminated one by one,
   wherein the orientation degree in a layer in the second metal layers that is closest to a surface of the piezoelectric substrate is higher than the orientation degree in a layer in the second metal layers that is apart from the surface of the piezoelectric substrate.

6. The surface acoustic wave element according to claim 5, wherein the first metal layer comprises titanium or a titanium alloy, and the second metal layers comprise aluminum or an aluminum alloy.

7. The surface acoustic wave element according to claim 6, where in a layer in the first metal layer that is closest to the surface of the piezoelectric substrate has a thickness of 30 to 80 Å.

8. The surface acoustic wave element according to claim 1, wherein the second metal layers include crystal grains formed continuously from a surface apart from a surface of the piezoelectric substrate to a surface close to the surface of the piezoelectric substrate.

9. The surface acoustic wave element according to claim 8, wherein crystal grains whose sizes are larger in the direction of a principal surface than in the thickness direction of the metal layer occupy the major part.

10. A communication device using the surface acoustic wave element according to claim 1 as a duplexer.

11. A communication device using the surface acoustic wave element according to claim 5 as a duplexer.

\* \* \* \* \*